US008827495B2

(12) United States Patent
Ishizaki et al.

(10) Patent No.: US 8,827,495 B2
(45) Date of Patent: Sep. 9, 2014

(54) LIGHT-EMITTING DEVICE

(71) Applicant: Sharp Kabushiki Kaisha, Osaka (JP)

(72) Inventors: Shinya Ishizaki, Osaka (JP); Tomokazu Nada, Osaka (JP); Makoto Agatani, Osaka (JP); Makoto Matsuda, Osaka (JP); Shinji Osaki, Osaka (JP); Tatsuya Morioka, Osaka (JP); Hitoshi Matsushita, Osaka (JP); Toyonori Uemura, Osaka (JP); Toshio Hata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/133,175

(22) Filed: Dec. 18, 2013

(65) Prior Publication Data

US 2014/0103797 A1    Apr. 17, 2014

Related U.S. Application Data

(63) Continuation of application No. 13/152,587, filed on Jun. 3, 2011, now Pat. No. 8,651,696.

(30) Foreign Application Priority Data

Jun. 4, 2010    (JP) ................................. 2010-129346

(51) Int. Cl.
*H01L 33/00*    (2010.01)
*H05B 33/22*    (2006.01)
*H01L 25/075*   (2006.01)
*H01L 33/60*    (2010.01)
*H01L 33/62*    (2010.01)

(52) U.S. Cl.
CPC ............... *H05B 33/22* (2013.01); *H01L 33/60* (2013.01); *H01L 25/0753* (2013.01); *H01L 2224/48137* (2013.01); *H01L 33/62* (2013.01)

USPC .............. 362/249.02; 362/249.01; 257/98

(58) Field of Classification Search
USPC ............... 362/235, 238, 240, 241, 244, 245, 362/249.01, 249.02, 249.11, 326, 327, 800; 257/79, 98–100, 687, 787–790, 795, 257/E31.117, E31.118, E31.127, E33.001, 257/E33.059; 174/520, 521, 524, 527, 532, 174/538, 549

See application file for complete search history.

(56) References Cited

U.S. PATENT DOCUMENTS

| 4,450,461 | A  | * | 5/1984  | Cook et al. ............... 257/82 |
| 6,474,836 | B1 |   | 11/2002 | Konagaya |
| 7,064,424 | B2 | * | 6/2006  | Wilson ..................... 257/680 |
| 7,521,728 | B2 | * | 4/2009  | Andrews ................... 257/100 |
| 8,049,237 | B2 | * | 11/2011 | Yamada et al. ............ 257/98 |
| 2009/0102067 | A1 | * | 4/2009 | Wyland ..................... 257/784 |
| 2009/0166657 | A1 |   | 7/2009 | Yamada et al. |
| 2010/0193822 | A1 | * | 8/2010 | Inobe et al. ................ 257/98 |
| 2011/0012151 | A1 | * | 1/2011 | Ono ........................... 257/98 |

FOREIGN PATENT DOCUMENTS

| JP | 2003-51620  | 2/2003 |
| JP | 2009-164157 | 7/2009 |
| JP | 2009-182307 | 8/2009 |

OTHER PUBLICATIONS

Office Action issued for U.S. Appl. No. 13/152,587, dated Mar. 6, 2013.
Notice of Allowance issued for U.S. Appl. No. 13/152,587, dated Sep. 30, 2013.

* cited by examiner

*Primary Examiner* — Hargobind S Sawhney
(74) *Attorney, Agent, or Firm* — Nixon & Vanderhye PC

(57)    ABSTRACT

The light-emitting device includes: a substrate which has a single layer structure in which a conductive member is partially provided on a surface of the substrate; a plurality of light-emitting elements which are directly provided on the surface of the substrate so as to be electrically connected with the conductive member; a first light reflection resin layer; a second light reflection resin layer which is provided in a looped shape on the surface of the substrate so as to surround an area in which the plurality of light-emitting elements are provided; and a sealing resin which covers the plurality of light-emitting elements. In the area in which the plurality of light-emitting elements are provided, the conductive member is covered with the first light reflection resin layer, the conductive member, which is provided under the second light reflection resin layer, is covered with the second light reflection resin layer directly, and a printed resistor, which is provided under the second light reflection resin layer, is covered with the second light reflection resin layer via the first light reflection resin layer. This makes it possible to provide the light-emitting device which (i) reduces absorption of light so as to achieve excellent light extraction efficiency, and (ii) is highly reliable.

1 Claim, 12 Drawing Sheets

| BETWEEN PRINTED RESISTOR AND LIGHT-EMITTING ELEMENT (mm) | LUMINOUS FLUX AFTER pkg (lm) | RELATIVE LUMINOUS FLUX |
|---|---|---|
| 0.85 | 622 | 1.000 |
| 0.65 | 621 | 0.998 |
| 0.55 | 622 | 1.000 |
| 0.45 | 616 | 0.990 |

LIGHT-EMITTING DEVICE

This Nonprovisional application is a continuation of U.S. patent application Ser. No. 13/152,587, filed Jun. 3, 2011 and claims priority under 35 U.S.C. §119(a) on Patent Application No. 2010-129346 filed in Japan on Jun. 4, 2010, the entire contents of which are hereby incorporated by reference.

TECHNICAL FIELD

The present invention relates to a light-emitting device which can be used as light sources for an illuminating device and a display device. The present invention particularly relates to a light-emitting device which (i) achieves excellent light extraction efficiency and (ii) is highly reliable.

BACKGROUND ART

Conventionally, various kinds of devices such as an illuminating device and a display device, each of which includes a light-emitting element (also called semiconductor light-emitting element) as a light source, have been developed, and it has been studies how to improve optical outputs of such devices have been carried out. For example, Patent Literature 1 discloses a light-emitting device 950 which is shown in FIGS. 11(a) and 11(b). FIG. 11(a) is a top view schematically illustrating a structure of the conventional light-emitting device 950, and FIG. 11(b) is a schematic view illustrating a production process of the light-emitting device 950.

A method for producing the conventional light-emitting device 950 includes the steps of: providing a light-emitting element 969 on a conductive wiring 965 which is provided on a substrate 974; electrically connecting the light-emitting element 969 with the conductive wiring 965 via a wire 976; providing on the substrate 974, a light reflection resin 960 for reflecting light emitted from the light-emitting element 969, wherein the light reflection resin 960 is provided so as to (i) partially cover the conductive wiring 965 and (ii) surround a periphery of the light-emitting element 969; and providing, after the light reflection resin 960 is hardened, a sealing member (not illustrated) so as to cover the light-emitting element 969. The light reflection resin 960 is provided with the use of a resin discharging device 972 (see (b) of FIG. 11).

CITATION LIST

Patent Literature

Patent Literature 1
Japanese Patent Application Publication, Tokukai, No. 2009-182307 (Publication Date: Aug. 13, 2009)

SUMMARY OF INVENTION

Technical Problem

However, the conventional light-emitting device 950 has a problem that its light extraction efficiency is not sufficient, because light is absorbed due to a configuration of the light-emitting device 950.

In general, the light-emitting device itself has such size restriction, since it is difficult to miniaturize the light-emitting device. In view of this, it is necessary to provide a number of light-emitting elements on a small substrate in order to improve an optical output. In a case where a number of light-emitting elements 969 are provided in the conventional light-emitting device 950, wiring of a conductor line becomes complicated, in such a way that (i) the conductor line is provided in the center of a light-emitting section and (ii) more than one conductor lines are provided. This causes the light extraction efficiency to be further deteriorated because light is absorbed by the conductive wiring 965 and also by the additionally provided conductor line(s).

Moreover, the conventional light-emitting device 950 has also a problem that its reliability is low because the light absorption causes the light emission to be nonuniform, lower in light output amount, and undesired or uneven in chromaticity.

The present invention is accomplished in view of the conventional problem, and its object is to provide a light-emitting device which (i) reduces absorption of light so as to achieve excellent light extraction efficiency, and (ii) is highly reliable.

Solution to Problem

In order to attain the object, a light-emitting device of the present invention includes: a substrate which has a single layer structure in which a conductive member is provided on part of a surface of the substrate; a plurality of light-emitting elements which are directly provided on the surface of the substrate so as to be electrically connected with the conductive member; a first light reflection resin layer which is made of a first resin having a light reflection property; a second light reflection resin layer which is made of a second resin having a light reflection property, the second light reflection resin layer being provided in a looped shape on the surface of the substrate so as to surround an area in which the plurality of light-emitting elements are provided; and a sealing resin which covers the plurality of light-emitting elements, in the area in which the plurality of light-emitting elements are provided, the conductive member being covered with the first light reflection resin layer, and, under the second light reflection resin layer, the conductive member being covered with the second light reflection resin layer via the first light reflection resin layer, or being covered with the second light reflection resin layer directly.

According to the configuration, the plurality of light-emitting elements are provided directly on the surface of the substrate, and accordingly it is possible to improve a heat radiation property. Moreover, the conductive members, which are provided in the area in which the plurality of light-emitting elements are provided, are covered with the first light reflection resin layer, and this allows the first light reflection resin layer to be used to prevent a short circuit between the conductive members.

In a case where a number of light-emitting elements are provided on a substrate having a single layer structure, wiring of a conductor line becomes complicated, in such a way that (i) the conductor line is provided in the center of a light-emitting section and (ii) more than one of conductor lines are provided. Moreover, a printed resistor can be provided so as to protect the number of light-emitting elements. The conductor line and the printed resistor, each of which is a conductive member, absorbs light, and therefore cause the light emission to be nonuniform, lower in light output amount, and undesired or uneven in chromaticity.

On the other hand, according to the configuration of the present invention, the conductive member, which is provided in the area in which the plurality of light-emitting elements are provided, is covered with the first light reflection resin layer. Moreover, the conductive member, which is provided under the second light reflection resin layer is covered with the second light reflection resin layer via the first light reflection resin layer, or covered with the second light reflection resin layer directly.

This makes it possible (i) to sufficiently reduce absorption of light by the conductive member and, moreover, (ii) to prevent the light emission from becoming nonuniform, lower in light output amount, and undesired or uneven in chromaticity. It is therefore possible to provide a light-emitting device which (i) reduces absorption of light so as to achieve excellent light extraction efficiency, and (ii) is highly reliable.

In particular, in a case where the printed resistor is provided as the conductive member, absorption of light by the printed resistor, which is black, can be reduced to the minimum by disposing the printed resistor below the second light reflection resin layer so as to be covered with two layers, i.e., with the first light reflection resin layer and the second light reflection resin layer. Moreover, the configuration makes it possible to reduce gap, and this prevents the sealing resin from leaking outside. Therefore, the sealing resin can be formed stably.

Advantageous Effects of Invention

As described above, the light-emitting device of the present invention includes: a substrate which has a single layer structure in which a conductive member is provided on part of a surface of the substrate; a plurality of light-emitting elements which are directly provided on the surface of the substrate so as to be electrically connected with the conductive member; a first light reflection resin layer which is made of a first resin having a light reflection property; a second light reflection resin layer which is made of a second resin having a light reflection property, the second light reflection resin layer being provided in a looped shape on the surface of the substrate so as to surround an area in which the plurality of light-emitting elements are provided; and a sealing resin which covers the plurality of light-emitting elements, in the area in which the plurality of light-emitting elements are provided, the conductive member being covered with the first light reflection resin layer, and, under the second light reflection resin layer, the conductive member being covered with the second light reflection resin layer via the first light reflection resin layer, or being covered with the second light reflection resin layer directly.

According to the configuration, the conductive member, which absorbs light, is covered with the first light reflection resin layer and the second light reflection resin layer, which sufficiently reflect light emitted from the plurality of light-emitting elements. This makes it possible (i) to sufficiently reduce absorption of light by the conductive member and, moreover, (ii) to prevent the light emission from becoming nonuniform, lower in light output amount, and undesired or uneven in chromaticity. It is therefore possible to provide a light-emitting device which (i) reduces absorption of light so as to achieve excellent light extraction efficiency, and (ii) is highly reliable.

BRIEF DESCRIPTION OF DRAWINGS

FIG. 5($b$) is a cross sectional view taken along the line B-B of FIG. 3.

FIG. 5($c$) is a cross sectional view taken along the line C-C of FIG. 4.

FIG. 7($b$) is a cross sectional view illustrating a production process of the light-emitting device shown in FIG. 1, where the sealing resin is provided.

FIG. 8($b$) is a cross sectional view illustrating a production process of the light-emitting device shown in FIG. 1, where the sealing resin is provided.

FIG. 11($b$) is a schematic view illustrating a production process of the light-emitting device shown in FIG. 11($a$).

DESCRIPTION OF EMBODIMENTS

Figure 1:
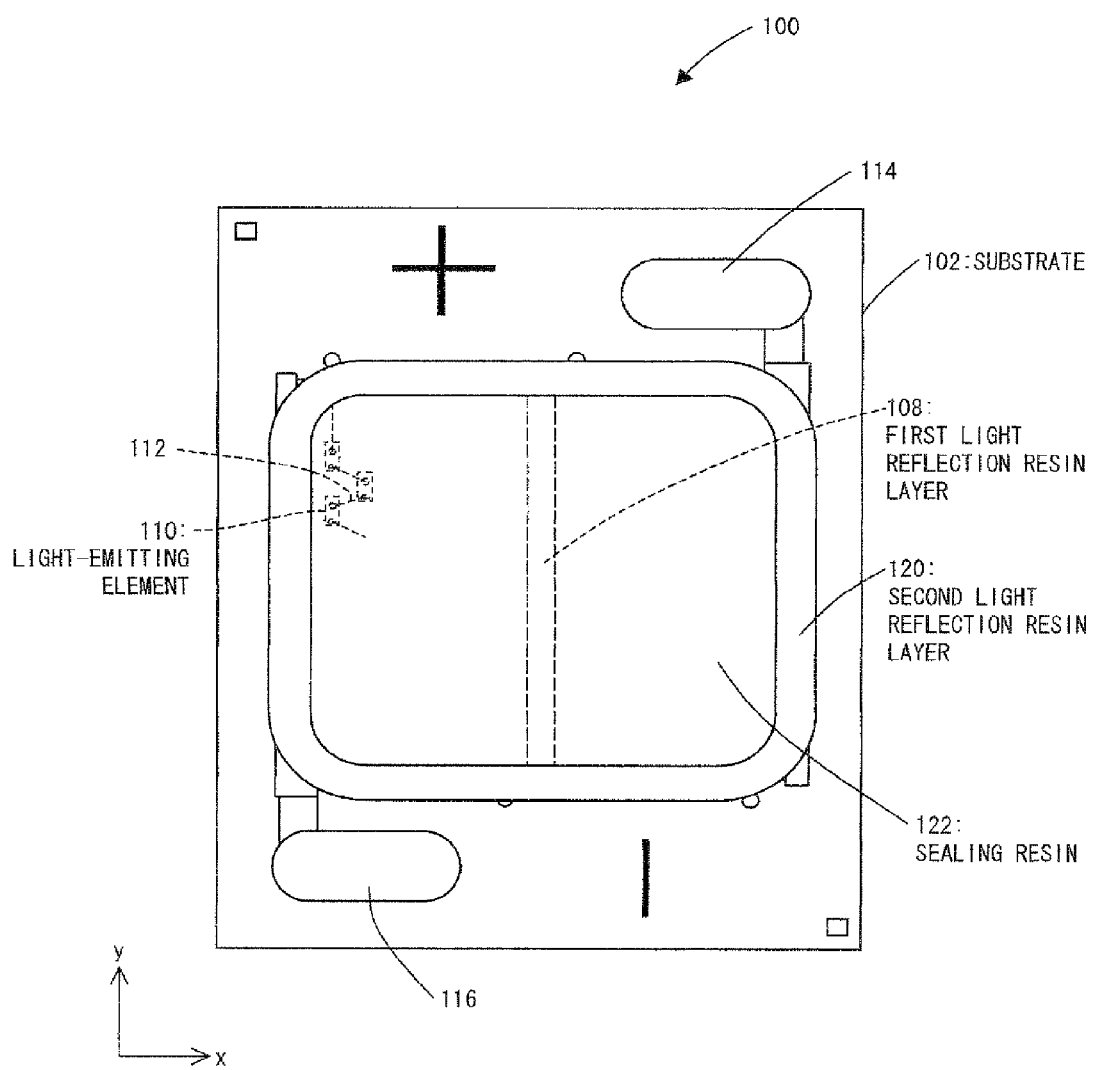
FIG. 1 is a plane view illustrating an embodiment of a light-emitting device in accordance with the present invention.

The following describes an embodiment of the present invention with reference to drawings. A light-emitting device of the present invention can be used as a light source of a device such as an illuminating device and a display device. Note that, in the following descriptions, a crosswise direction in FIG. 1 is referred to as an x-direction (first direction) and lengthwise direction in FIG. 1 is referred to as a y-direction (second direction). Moreover, the plane view of FIG. 1 is a top view.

(Configuration of Light-Emitting Device)

Figure 2:
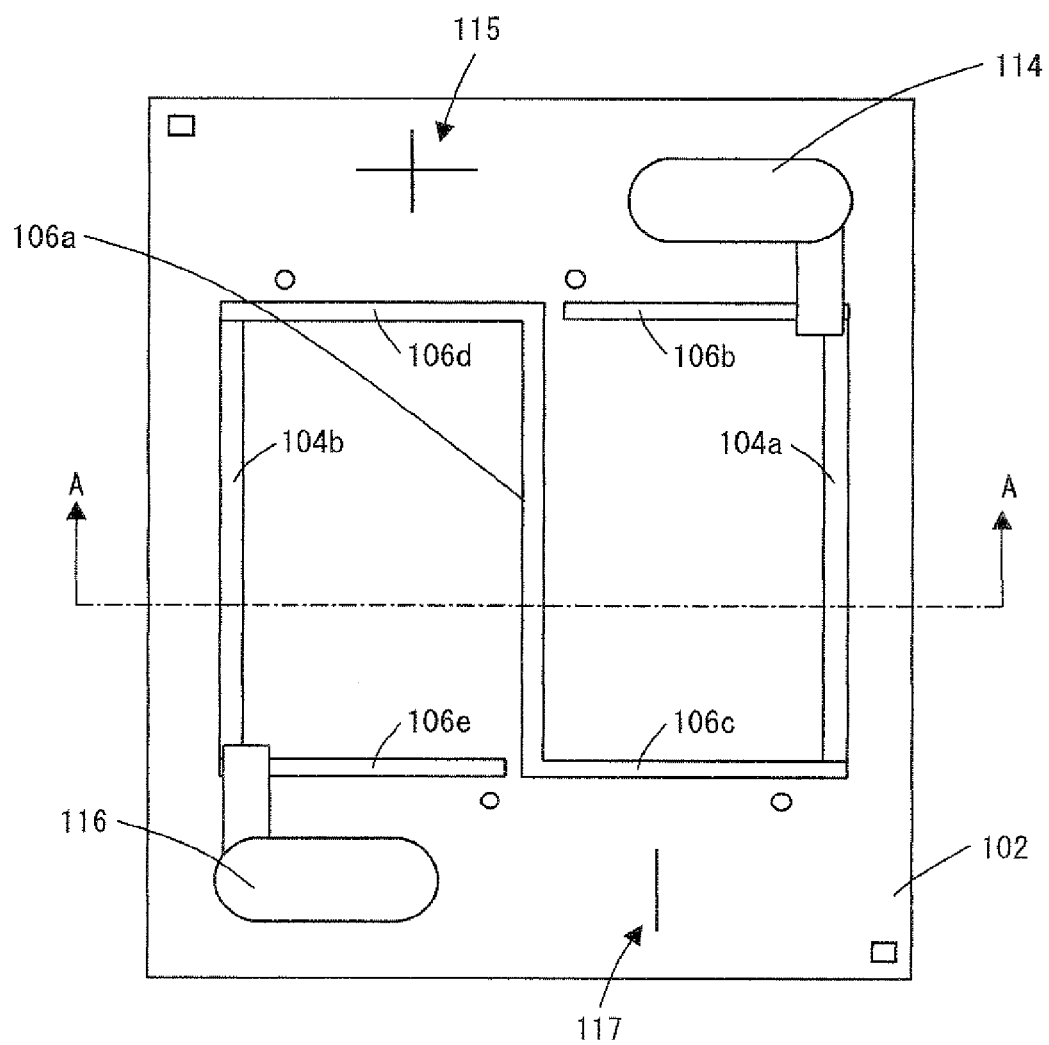
FIG. 2 is a plane view illustrating a production process of the light-emitting device shown in FIG. 1, where conductor lines and printed resistors are provided.
Figure 3:
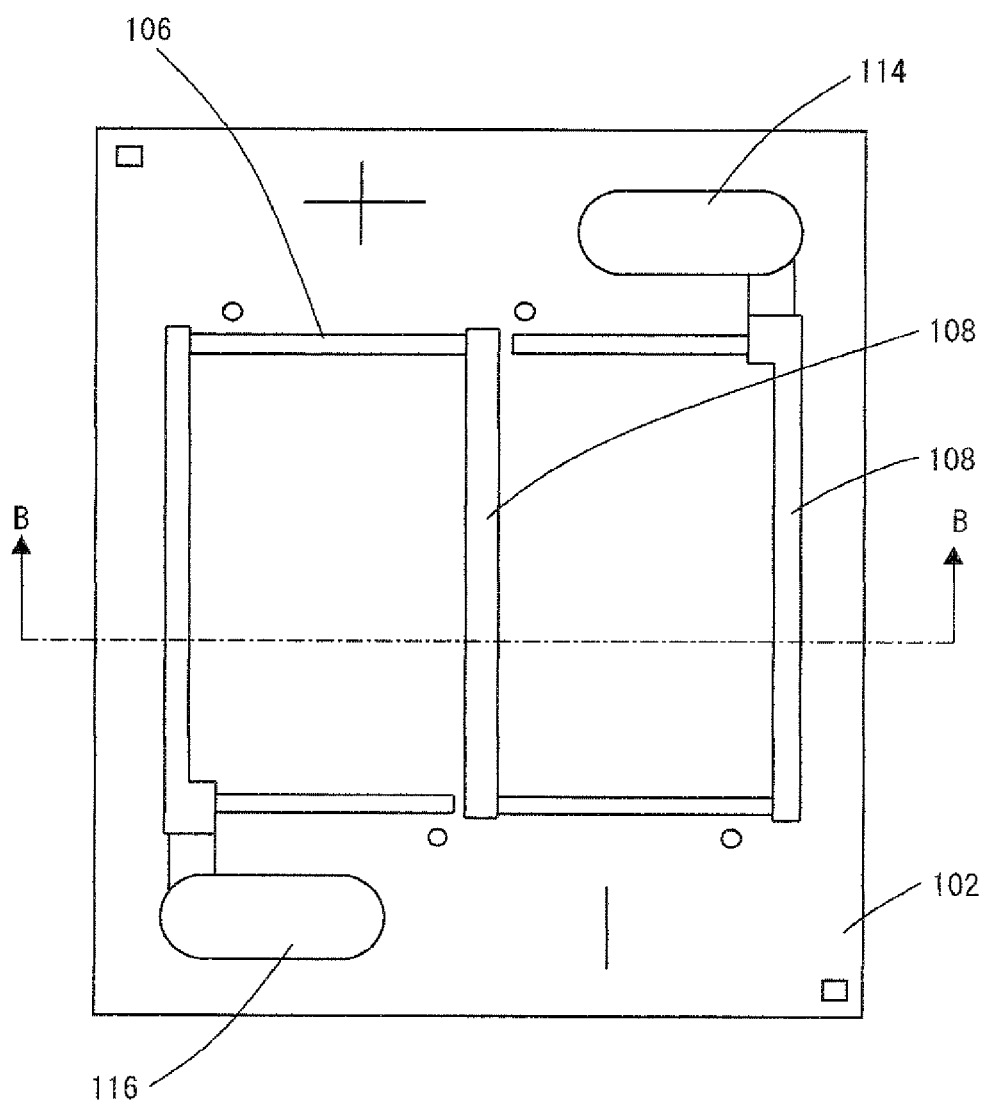
FIG. 3 is a plane view illustrating a production process of the light-emitting device shown in FIG. 1, where a first light reflection resin layer is provided.
Figure 4:
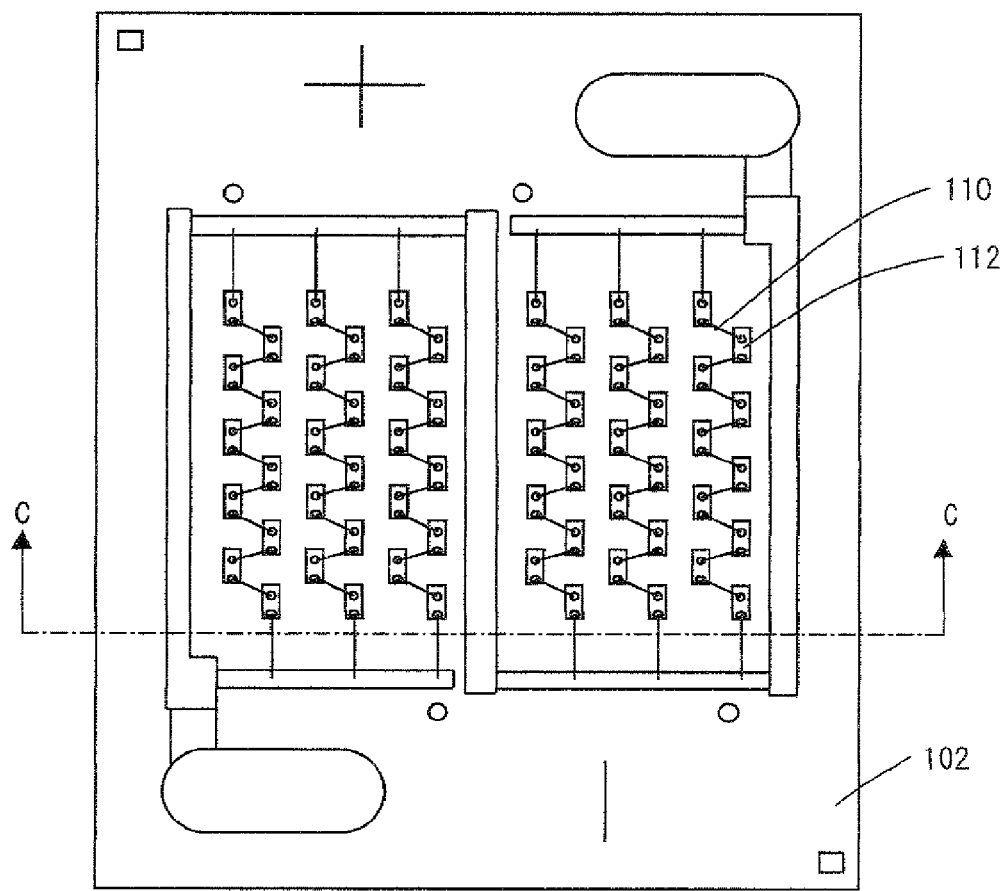
FIG. 4 is a plane view illustrating a production process of the light-emitting device shown in FIG. 1, where a plurality of light-emitting elements are provided.
Figure 5:
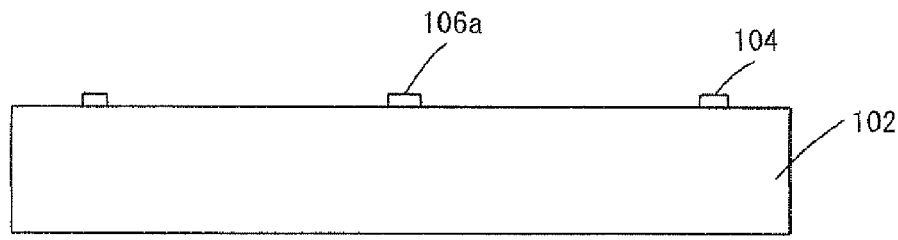
FIG. 5($a$) is a cross sectional view taken along the line A-A of FIG. 2.
Figure 5:
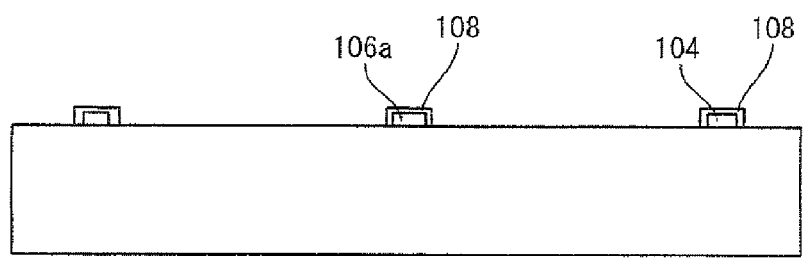
Figure 5:
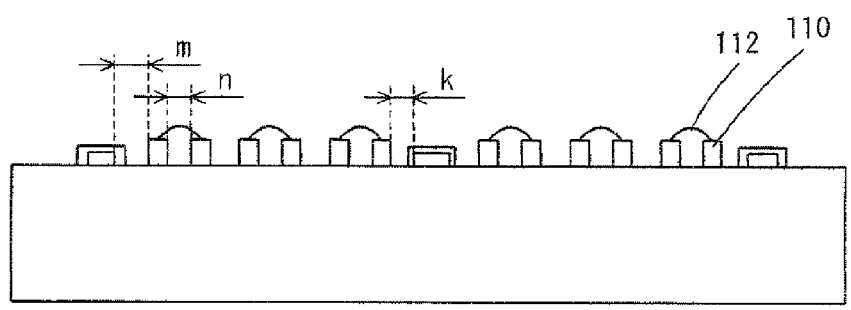
Figure 6:
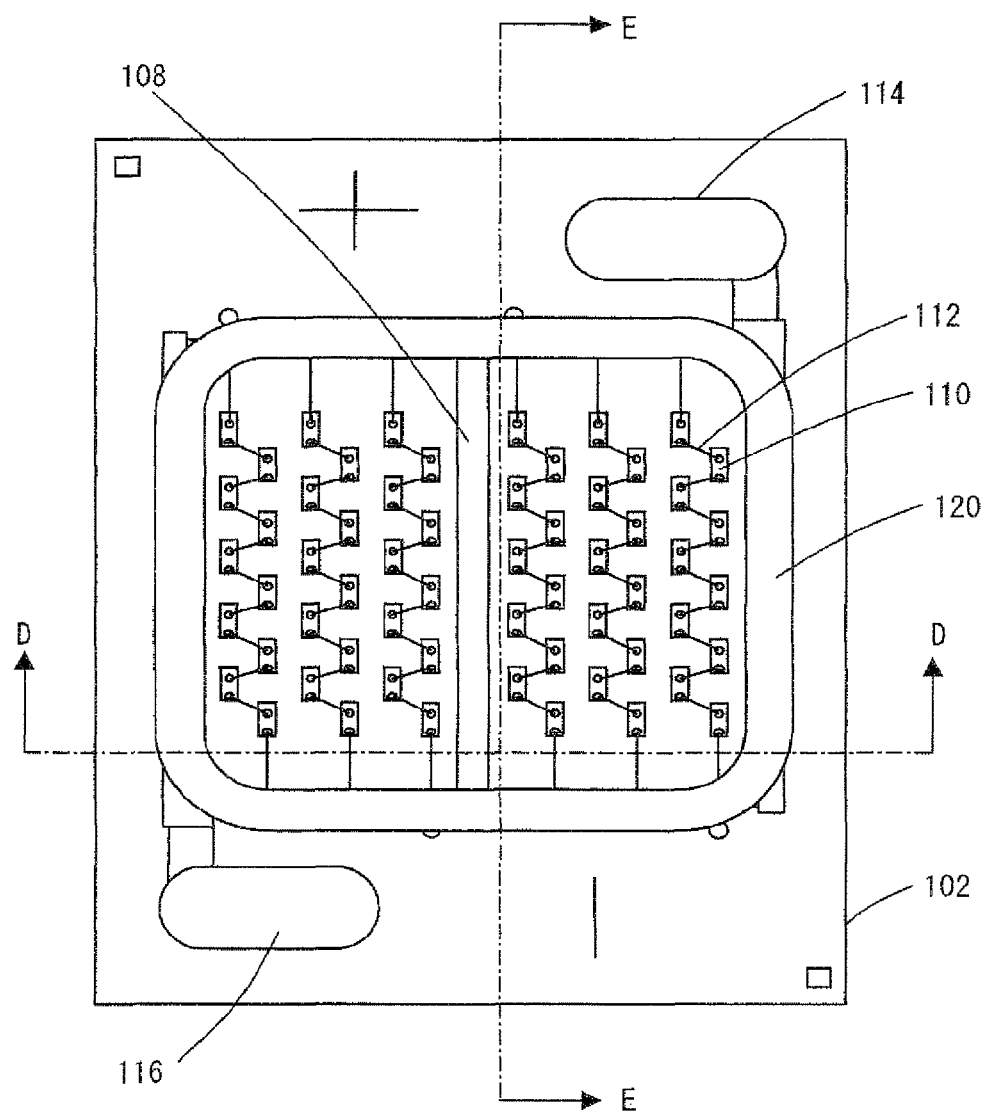
FIG. 6 is a plane view illustrating a production process of the light-emitting device shown in FIG. 1, where a second light reflection resin layer is provided.
Figure 7:
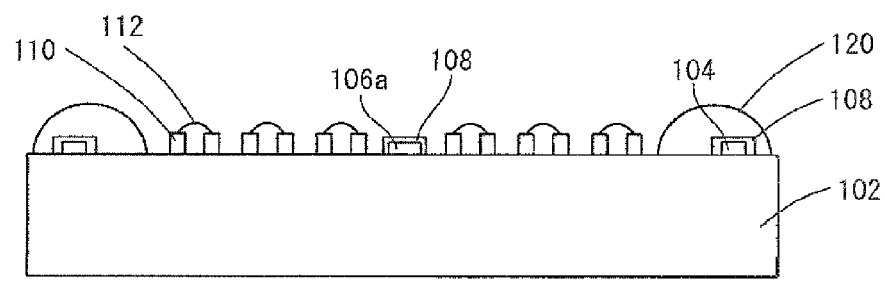
FIG. 7($a$) is a cross sectional view, taken along the line D-D of FIG. 6, illustrating a production process of the light-emitting device shown in FIG. 1.
Figure 7:
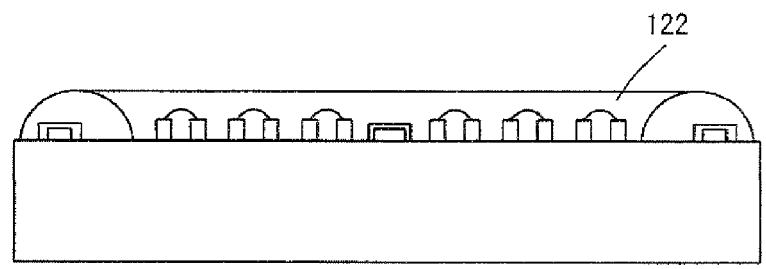
Figure 8:
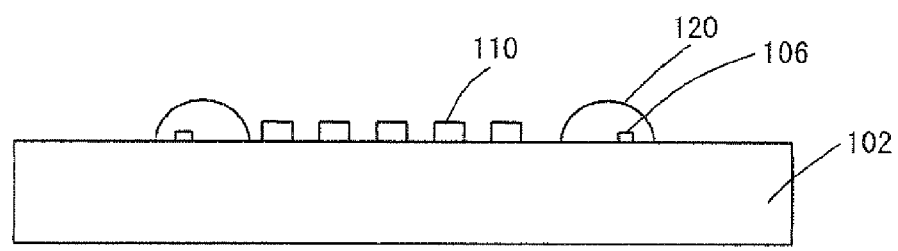
FIG. 8($a$) is a cross sectional view, taken along the line E-E of FIG. 6, illustrating a production process of the light-emitting device shown in FIG. 1.
Figure 8:
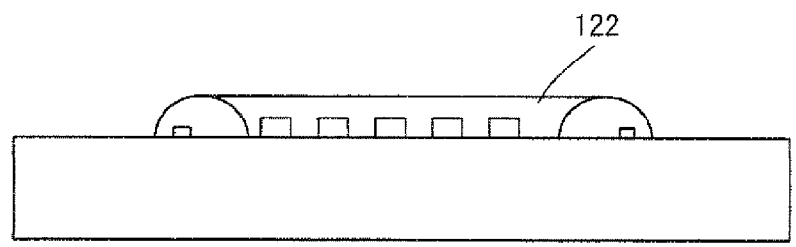

FIG. 1 is a top view illustrating a configuration example of a light-emitting device 100 of the present embodiment. FIG. 2 through FIG. 8($b$) illustrate production processes of the light-emitting device 100. FIG. 2 illustrates a configuration in which a conductor line 106 and a printed resistor 104 are provided. FIG. 3 illustrates a configuration in which a first light reflection resin layer 108 is provided. FIG. 4 illustrates a configuration in which a plurality of light-emitting elements 110 are provided. FIG. 5($a$) is a cross sectional view taken along the line A-A of FIG. 2. FIG. 5($b$) is a cross sectional view taken along the line B-B of FIG. 3. FIG. 5($c$) is a cross sectional view taken along the line C-C of FIG. 4. FIG. 6 illustrates a configuration in which a second light reflection resin layer 120 is provided. FIG. 7(a) is a cross sectional view taken along the line D-D of FIG. 6. FIG. 7(b) illustrates a configuration in which a sealing resin is provided. FIG. 8(a) is a cross sectional view taken along the line E-E of FIG. 6. FIG. 8(b) illustrates a configuration in which a sealing resin is provided.

The light-emitting device 100 of the present embodiment is a light-emitting device including light-emitting elements (also called semiconductor light-emitting elements). The light-emitting device 100 of the present embodiment includes a substrate 102, a printed resistor 104, a plurality of light-emitting elements 110, a first light reflection resin layer 108, a second light reflection resin layer 120, and a sealing resin 122 (see FIG. 1 through FIG. 8(b)).

The substrate 102 is a ceramic substrate made of ceramic and has a single layer structure. The substrate 102 has a rectangular shape, when viewed from above. The plurality of light-emitting elements 110, the first light reflection resin layer 108, the second light reflection resin layer 120, and the sealing resin 122 are provided on one face (hereinafter, referred to as a front face) of the substrate 102. Further, on the front face of the substrate 102, the printed resistor 104, the conductor line 106, an anode electrode 114, and a cathode electrode 116 are directly provided (see FIG. 2).

The conductor line 106 serves as (i) an electrode which is electrically connected with the plurality of light-emitting elements 110 by wire-bonding and (ii) a wire which is routed around for securing electrical connection. As the conductor line 106, conductor lines 106a through 106e which are made of gold (Au) are formed. The conductor line 106a is a wire which is not wire-bonded. Note, however, that the conductor line 106 is not limited to the conductor lines 106a through 106e, provided that the conductor line 106 is partially provided depending on a circuit configuration of the plurality of light-emitting elements 110. In the following description, the term "conductor line 106" is used to collectively refer to the conductor lines 106a through 106e.

The anode electrode 114 and the cathode electrode 116 are provided so as to be connected with an external voltage supply for the light-emitting device 100 in order that a voltage may be supplied to the plurality of light-emitting elements 110. The anode electrode 114 and the cathode electrode 116 are made of, for example, silver (Ag)-platinum (Pt). The anode electrode 114 and the cathode electrode 116 are provided in the vicinity of respective opposing corners (upper right and lower left in FIG. 2) of the front face of the substrate 102.

The printed resistor 104 is a resistor element which is prepared by burning to fix a resistance component in paste form onto the substrate 102 on which the resistor element has been printed. The printed resistor 104 is partially provided (as a printed resistor 104a and a printed resistor 104b) so as to be connected in parallel with a circuit in which the plurality of light-emitting elements 110 are connected in series with each other. Such a circuit configuration allows the plurality of light-emitting elements 110 to be protected from an electrostatic discharge withstand voltage. Hereinafter, the term "printed resistor 104" is used to collectively refer to the printed resistor 104a and the printed resistor 104b.

In this embodiment, each of the plurality of light-emitting elements 110 is a blue light-emitting element whose emission peak wavelength is approximately 450 nm. However, the present invention is not limited to this. For example, the light-emitting element 110 may be an ultraviolet (near-ultraviolet) light-emitting element, whose emission peak wavelength falls within a range between 390 nm and 420 nm. This makes it possible to further improve light emitting efficiency. The plurality of light-emitting elements 110 are provided at respective predetermined locations (see FIG. 4) so as to secure a predetermined amount of light, and the number of the plurality of light-emitting elements 110 is 60 in the present embodiment. The plurality of light-emitting elements 110 are electrically connected with each other by wire-bonding with the use of wires 112. Each of the wires 112 is made of, for example, gold.

The first light reflection resin layer 108 reflects light emitted from the plurality of light-emitting elements 110 and prevents the conductor line 106 and the printed resistor 104 from absorbing light. The first light reflection resin layer 108 is a white insulator and therefore is called also "white resist". The first light reflection resin layer 108 is mainly made of resin and zirconium oxide ($ZrO_2$), which is a light diffusing agent. However, the present embodiment is not limited to this and therefore an insulating resin (first resin) which has a light reflection property can be used. The first light reflection resin layer 108 is provided so as to cover the conductor line 106a and the printed resistor 104.

The second light reflection resin layer 120 reflects light emitted from the plurality of light-emitting elements 110 and prevents the conductor line 106 and the printed resistor 104 from absorbing light. The second light reflection resin layer 120 is made of silicone resin which contains alumina filler. However, the present embodiment is not limited to this, and therefore an insulating resin (second resin) having a light reflection property can be used. The second light reflection resin layer 120 is looped, when viewed from above, in a rectangular shape with round corners so as to surround an area in which all the plurality of light-emitting elements 110 are provided. However, the looped shape of the second light reflection resin layer 120 is not limited to this.

The sealing resin 122 is a sealing resin layer made of a light-transmitting resin containing a fluorescent substance. The sealing resin 122 is filled in the area surrounded by the second light reflection resin layer 120. That is, the sealing resin 122 is provided in the area in which the plurality of light-emitting elements 110 are provided and covers the plurality of light-emitting elements 110, the wires 112, and the first light reflection resin layer 108.

The fluorescent substance is excited by primary light emitted by the plurality of light-emitting elements 110 and releases light whose wavelength is longer than that of the primary light. Note that the fluorescent substance can be appropriately selected depending on a desired white chromaticity. For example, a combination of natural white and warm white can be (i) a combination of YAG yellow fluorescent substance and (Sr, Ca)$AlSiN_3$:Eu (red fluorescent substance) and (ii) a combination of YAG yellow fluorescent substance and $CaAlSiN_3$:Eu (red fluorescent substance). A combination of high-rendering colors can be a combination of (Sr, Ca)$AlSiN_3$:Eu (red fluorescent substance) and $Ca_3$(Sc, Mg)$_2Si_3O_{12}$:Ce (green fluorescent substance). However, the present invention is not limited to these combinations, and therefore another combination of fluorescent substances can be employed. Alternatively, only YAG yellow fluorescent substance can be used so as to achieve pseudo white.

(Method for Producing Light-Emitting Device)

The following describes how the light-emitting device 100 having the above described configuration is produced. Note that the light-emitting device 100 is produced by dicing in the end of the production process, so that a plurality of light-emitting devices which have been prepared integrally are divided into individual light-emitting devices. Specifically, the plurality of light-emitting devices are diced along a periphery (four sides) thereof. For convenience, however, the following descriptions and the drawings focus on, as appropriate, one of the plurality of light-emitting devices.

<Formation of Conductor Line>

First, the conductor line 106, the anode electrode 114, and the cathode electrode 116 are formed on the substrate 102 (see FIG. 2). The formation can be carried out by, for example, a printing method, etc.

The conductor line 106a (fifth conductor line) is formed so as to (i) be connected with the conductor line 106c and the conductor line 106d and (ii) extend in the y-direction. The conductor line 106b (first conductor line) is formed so as to extend in the x-direction. The conductor line 106c (second conductor line) is in parallel with the conductor line 106b in the y-direction and extends in the x-direction. The conductor line 106d (third conductor line) extends in the x-direction on an extension of the conductor line 106b. Note that the conductor line 106d is not connected with the conductor line 106b. The conductor line 106e (fourth conductor line) is in parallel with the conductor line 106d in the y-direction and extends in the x-direction on an extension of the conductor line 106c. Note that the conductor line 106e is not connected with the conductor line 106c. The conductor line 106a is arranged substantially in the center of a light-emitting section. That is, the conductor line 106a is arranged, when viewed from above, so as to divide the area, in which the plurality of light-emitting elements 110 are provided, into two areas. The conductor lines 106b through 106e are disposed (i) outer side of the area in which the plurality of light-emitting elements 110 are provided and (ii) below the second light reflection resin layer 120. The conductor line 106b is connected with the anode electrode 114 and the conductor line 106e is connected with the cathode electrode 116.

It is preferable to provide an anode electrode mark 115 in the vicinity of the anode electrode 114 so that the anode electrode 114 can be visually identified as an anode electrode. Similarly, it is preferable to provide a cathode electrode mark 117 in the vicinity of the cathode electrode 116 so that the cathode electrode 116 can be visually identified as a cathode electrode.

<Formation of Printed Resistor>

Subsequently, the printed resistor 104 is formed on the substrate 102 (see FIG. 2). Specifically, the printed resistor 104 is formed by production processes including (i) a printing step and (ii) a burning step. In the printing step, a paste containing a resistance component is screen-printed at a predetermined location so that the paste and an edge of the conductor line 106 overlap each other (i.e., so that the paste is provided partially on the conductor line 106). The paste is composed by ruthenium dioxide ($RuO_2$, ruthenium as conductive powder), a fixing agent, a resin, and a solvent. Then, in the burning step, the substrate 102 on which the paste is provided is burned in an electric furnace so that the paste is fixed on the substrate 102. This is how the printed resistor 104 is formed. Note that the conductive powder is not limited to ruthenium and therefore it is possible to use a metal or an oxide which does not get soft under a condition at a burning temperature or less.

With the processes described above, (i) the printed resistor 104a (first printed resistor) which is in contact with the conductor line 106b and the conductor line 106c and extends in the y-direction and (ii) the printed resistor 104b (second printed resistor) which is in contact with the conductor line 106d and the conductor line 106e and extends in the y-direction are formed. The printed resistor 104a and the printed resistor 104b are substantially in parallel with each other. The printed resistor 104a is provided so as to be electrically connected with one end of the conductor line 106b and one end of the conductor line 106c. The printed resistor 104b is provided so as to be electrically connected with one end of the conductor line 106d and one end of the conductor line 106e. The printed resistor 104a and the printed resistor 104b are disposed (i) outer side of the area in which the plurality of light-emitting elements 110 are provided and (ii) below the second light reflection resin layer 120.

FIG. 5(a) is a cross sectional view illustrating a configuration in which the printed resistor 104 is provided. The printed resistor 104 and the conductor line 106a are provided on the surface of the substrate 102 (see FIG. 5(a)). The printed resistor 104 and the conductor line 106a are substantially in parallel with each other. The printed resistor 104 has a height of, for example, 8 µm.

<Formation of First Light Reflection Resin Layer>

Subsequently, the first light reflection resin layer 108 is formed so as to cover the conductor line 106a and the printed resistor 104 (see FIG. 3). The first light reflection resin layer 108 can be formed by, for example, a printing method, etc. Note that the first light reflection resin layer 108 formed by the printing method is subjected to a heating treatment at a temperature of 800° C. for ten minutes.

FIG. 5(b) is a cross sectional view illustrating a configuration in which the first light reflection resin layer 108 is provided. The printed resistor 104 and the conductor line 106a are covered with the first light reflection resin layer 108 (see FIG. 5(b)). The first light reflection resin layer 108 prevents a short circuit between the conductor lines 106.

It is preferable that the first light reflection resin layer 108 which covers the conductor line 106a has a height which falls within a range between 5 µm and 50 µm. As long as the first light reflection resin layer 108 has a height within this range, a chromaticity, an optical output, and uniformity in emitted light are not affected, even in a case where a stack of the conductor line 106a and the first light reflection resin layer 108 is provided in the center of the area surrounded by the second light reflection resin layer 120, i.e., in the center of the area in which the plurality of light-emitting elements 110 are provided.

<Provision of Light-Emitting Element>

Subsequently, the plurality of light-emitting elements 110 are provided on the substrate 102 (see FIG. 4). Specifically, first, the plurality of light-emitting elements 110 are die-bonded with the substrate 102 with the use of an adhesive resin such as silicone resin. Thirty (30) pieces of the plurality of light-emitting elements 110 are provided in each of (i) an area surrounded by the conductor lines 106a, 106b, and 106c, and the printed resistor 104a and (ii) an area surrounded by the conductor lines 106a, 106d, and 106e and the printed resistor 104b. That is, 60 pieces in total of the plurality of light-emitting elements 110 are provided on the substrate 102.

Each of the plurality of light-emitting elements 110 is a chip which (i) has a rectangular shape when viewed from above and (ii) has a thickness of, for example, 100 µm to 180 µm. On a rectangular upper face of each of the plurality of light-emitting elements 110, an anode chip electrode and a cathode chip electrode are provided so as to be in parallel with each other in a longer side direction.

The plurality of light-emitting elements 110 are arranged in columns so that, when viewed from above, a longer side direction thereof conforms to the y-direction (column direction). Moreover, the plurality of light-emitting elements 110 are arranged so that each first light-emitting element 110 in one of any adjacent two columns is disposed in a position corresponding to an intermediate section between second light-emitting elements 110 of the other of the any adjacent two columns, in order that a lateral side (longer side) of the each first light-emitting element 110 may not face, in the x-direction, a lateral side (longer side) of the second light-emitting elements 110. That is, the plurality of light-emitting elements 110 are provided in a so-called staggered arrangement. It is preferable that, when viewed from above the substrate 102, a distance between any adjacent two of the plurality of light-emitting elements 110 in the y-direction (i.e., a distance between shorter sides thereof) is smaller than a distance between any adjacent two of the plurality of light-emitting elements 110 in an oblique direction (i.e., a distance between longer sides thereof).

Subsequently, wire-bonding is carried out with the use of the wires 112. One of the plurality of light-emitting elements 110 which one is adjacent to the conductor line 106 is wire-bonded with the conductor line 106 via a chip electrode of the one of the plurality of light-emitting elements 110. Any adjacent two of the plurality of light-emitting elements 110, between which no conductor line 106 is provided, are connected with each other by wire-bonding via chip electrodes of the respective any adjacent two of the plurality of light-emitting elements 110. With this configuration, three series circuit sections, in each of which 20 pieces of the plurality of light-emitting element 110 are connected in series with each other, are connected in parallel with each other between the anode electrode 114 and the cathode electrode 116.

FIG. 5(c) is a cross sectional view illustrating a configuration in which the plurality of light-emitting elements 110 are provided. On the substrate 102, (i) the printed resistor 104 and the conductor line 106a, which are covered with the first light reflection resin layer 108, are provided, and (ii) the plurality of light-emitting elements 110, which are connected with each other via the wires 112, are provided (see FIG. 5(c)). The plurality of light-emitting elements 110 are provided directly on the surface of the substrate 102, and therefore a heat radiation property can be improved.

It is preferable that a distance m between the printed resistor 104 and one of the plurality of light-emitting elements 110 which one is the nearest to the printed resistor 104 (specifically, a distance between an edge of the printed resistor 104 and an edge of the one of the plurality of light-emitting elements 110) is 0.55 mm.

Figures 12, 13:
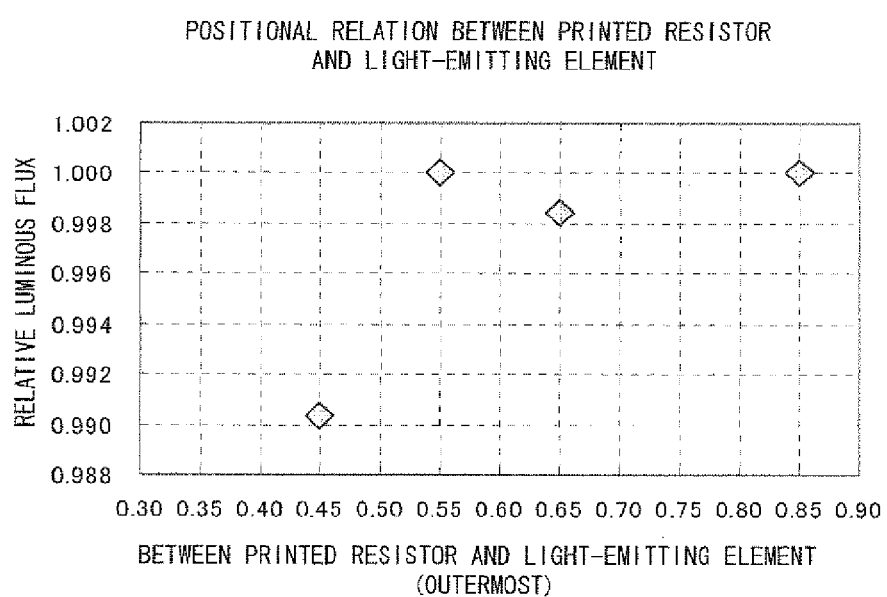
FIG. 12 is a table illustrating a relative luminous flux depending on a distance between the printed resistor and the light-emitting element in the light-emitting device shown in FIG. 1.
FIG. 13 is a graph illustrating a positional relation between the printed resistor and the light-emitting element shown in FIG. 12.

FIG. 12 shows a relative luminous flux which varies based on a distance between the printed resistor 104 and a light-emitting element 110. FIG. 13 is a graph illustrating a positional relation between the printed resistor 104 and the light-emitting element 110. In a case where the distance between the printed resistor 104 and the light-emitting element 110 is less than 0.55 mm, a relative luminous flux, that is, an optical output of the light-emitting device 100 is precipitously decreased (see FIGS. 12 and 13). From this, the distance between the printed resistor 104 and the light-emitting element 110 should be 0.55 mm or more, preferably, falls within a range between 0.55 mm and 0.92 mm, and optimally, 0.55 mm.

Similarly, it is preferable that a distance k between the conductor line 106a and one of the light-emitting elements 110 which one is the nearest to the conductor line 106a (specifically, (i) a distance between one edge of the conductor line 106a and an edge of a light-emitting element 110, which is disposed on the right of the conductor line 106a and (ii) a distance between the other edge of the conductor line 106a and an edge of a light-emitting element 110, which is disposed on the left of the conductor line 106a) is 0.55 mm. Moreover, it is preferable that a distance n between any adjacent two columns of the plurality of light-emitting elements 110 (specifically, a distance between longer sides, which are adjacent to each other in the x-direction, of respective light-emitting elements which belong to the any adjacent two columns) is 0.55 mm. In a case where 60 pieces (or more) of the plurality of light-emitting elements 110 are provided as described in the present embodiment, each optimal distance is 0.55 mm. However, in a case where the number of the plurality of light-emitting elements 110 is smaller than 60, the optimal distance is not limited to 0.55 mm. That is, in such a case, it is preferable that each of the distance k and the distance n is 0.65 mm or more.

<Formation of Second Light Reflection Resin Layer>

Subsequently, the second light reflection resin layer 120 is provided so as to cover the first light reflection resin layer 108, which covers the conductor lines 106b through 106e and the printed resistor 104 (see FIG. 6). Specifically, liquid silicone resin containing alumina filler is provided at a predetermined position with the use of, for example, a resin discharging device (not illustrated) by discharging the silicone resin from a circular opening of a nozzle of the resin discharging device. Then, the liquid silicone resin is subjected to a heat hardening process at a temperature of 120° C. for one hour so that a second light reflection resin layer 120 is formed. Note that the temperature and the time of the heat hardening process are mere examples, and therefore are not intended to limit the present invention.

FIGS. 7(a) and 8(a) are cross sectional views illustrating a configuration in which the second light reflection resin layer 120 is provided. The second light reflection resin layer 120 has a width of, for example, 0.9 mm. A highest point of the second light reflection resin layer 120 is higher than (i) a top face of each of the plurality of light-emitting elements 110 and (ii) the wires 112 (wire loops) via which the plurality of light-emitting elements 110 are connected with each other. Moreover, the highest point of the second light reflection resin layer 120 is set to be higher than a height of the first light reflection resin layer 108, which covers the conductor line 106a. This makes it possible to form the sealing resin 122 so that the plurality of light-emitting elements 110, the wires 112, and the first light reflection resin layer 108, which covers the conductor line 106a, are not exposed. This makes it possible to protect the plurality of light-emitting elements 110, the wires 112, and the first light reflection resin layer 108.

Moreover, wires 112 which are connected with the conductor lines 106b through 106e are at least partially covered with the second light reflection resin layer 120. This makes it possible to reduce or prevent peeling-off of wire.

The printed resistor 104 which is provided below the second light reflection resin layer 120 is covered with the second light reflection resin layer 120 via the first light reflection resin layer 108 (see FIG. 7(a)). That is, the printed resistor 104, the first light reflection resin layer 108, and the second light reflection resin layer 120 are stacked. Note that the second light reflection resin layer 120 does not intervene in the plurality of light-emitting elements 110.

In the second light reflection resin layer 120, the printed resistor 104 is provided so as to be farther from the plurality of light-emitting elements 110 than the center of a cross section of the second light reflection resin layer 120. That is, the printed resistor 104 is provided so as to be farther from the plurality of light-emitting elements 110 than an intermediate position between an inner side edge and an outer side edge of the second light reflection resin layer 120.

It is preferable that the printed resistor 104 is provided in a farther side, from the plurality of light-emitting elements 110, in the second light reflection resin layer 120 while satisfying the distance condition described above. According to the configuration, the second light reflection resin layer 120 is formed with a shorter perimeter. This allows the substrate 102 to be smaller in area and makes it possible to uniformize light-emitting sections.

The conductor lines 106b through 106e, which are provided below the second light reflection resin layer 120, are directly covered with the second light reflection resin layer 120 (see FIG. 8(a)). That is, each of the conductor lines 106b through 106e and the second light reflection resin layer 120 are stacked. Note that the second light reflection resin layer 120 does not intervene in the plurality of light-emitting elements 110.

In the second light reflection resin layer 120, the conductor lines 106b through 106e are provided so as to be farther from the plurality of light-emitting elements 110 than the center of the cross section of the second light reflection resin layer 120. That is, the conductor lines 106b through 106e are provided so as to be farther from the plurality of light-emitting elements 110 than the intermediate position between the inner side edge and the outer side edge of the second light reflection resin layer 120.

It is preferable that the conductor lines 106b through 106e are provided on a farther side, from the plurality of light-emitting elements 110, in the second light reflection resin layer 120. According to the configuration, the second light reflection resin layer 120 is formed with a shorter perimeter. This allows the substrate 102 to be smaller in area and makes it possible to uniformize light-emitting sections.

Figure 9:
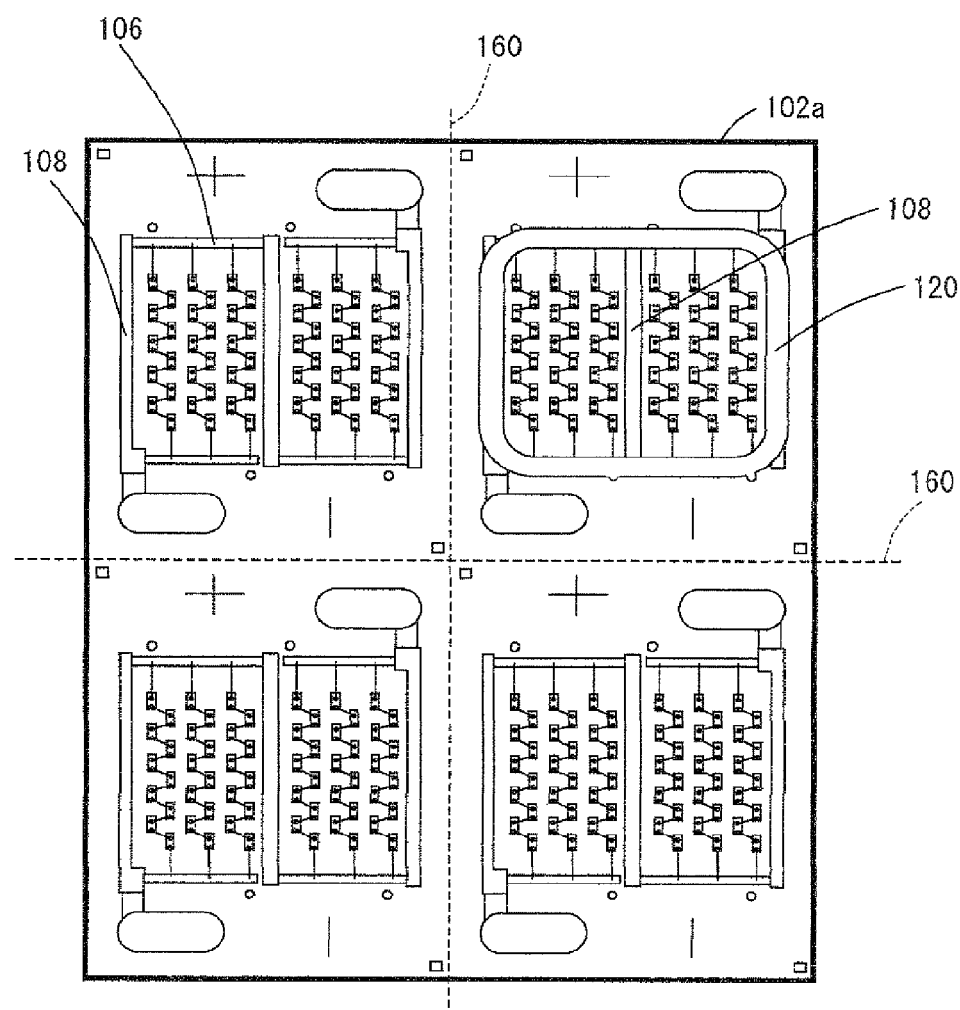
FIG. 9 is a plane view illustrating a production process of the light-emitting device shown in FIG. 1, where a second light reflection resin layer is provided before the step of individual dividing.

FIG. 9 shows a state in which the second light reflection resin layer 120 is formed before an individual dividing step in the production process. Light-emitting devices are consecutively provided on one (1) sheet of a large substrate 102a (see FIG. 9), and ultimately are divided, along dividing lines 160 surrounding (four sides of) each of the light-emitting devices, into individual light-emitting devices 100.

FIG. 9 illustrates a halfway state of the forming step of second light reflection resin layer 120, in which a second light reflection resin layer 120 is formed upper right in the drawing, after the plurality of light-emitting elements 110 are provided. The second light reflection resin layers 120 are formed one by one. Each of the second light reflection resin layers 120 is formed above (i) a stacked layer of the first light reflection resin layer 108 and the printed resistor 104 and (ii) the conductor lines 106b through 106e. A stacked layer of the first light reflection resin layer 108 and the conductor line 106a extends in the y-direction (i.e., in a top-to-bottom direction) substantially in the middle of the looped second light reflection resin layer 120.

Figure 10:
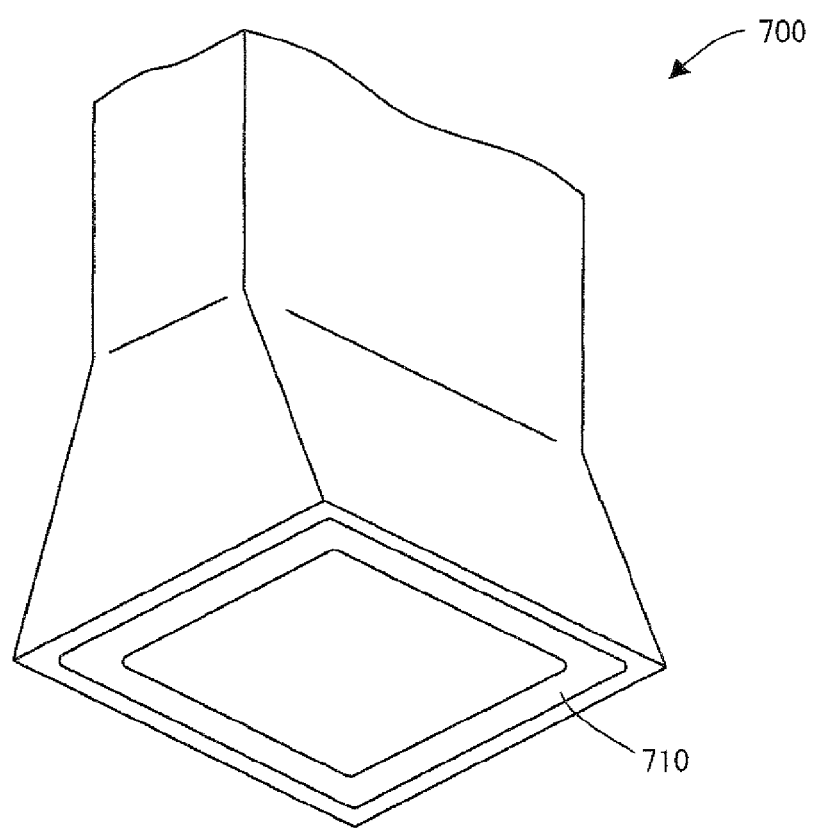
FIG. 10 is a perspective view illustrating a configuration example of an opening of a nozzle of a resin discharging device.
Figure 11:
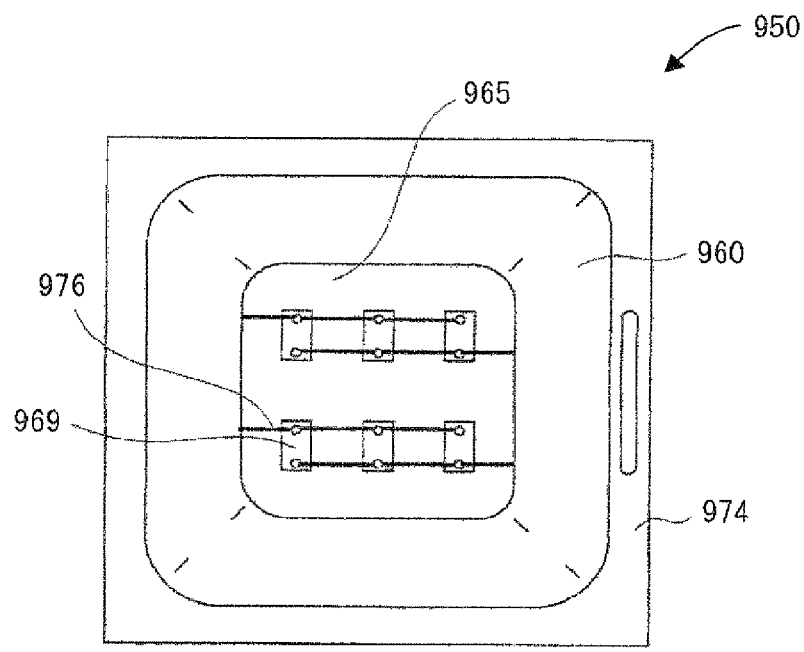
FIG. 11($a$) is a top view schematically illustrating a structure of a conventional light-emitting device.
Figure 11:
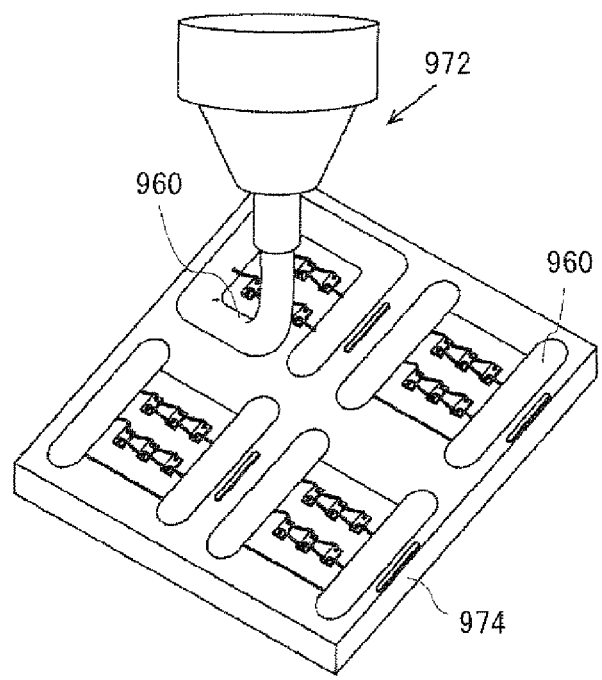

Note that the resin discharging device described above has a nozzle with a circular opening. However, the present embodiment is not limited to this. For example, a resin discharging device having a nozzle 700 with a rectangular opening 710 can be used (see FIG. 10). With the use of the nozzle 700, resin is discharged continuously from the opening 710 so that, in a short period of time, a looped second light reflection resin layer 120 having no seam can be formed. This makes it possible to prevent a protrusion of a seam, and therefore the second light reflection resin layer 120, which can reduce leakage of the sealing resin 122, can be provided.

<Formation of Sealing Resin>

Subsequently, the sealing resin 122 is formed on the substrate 102. Specifically, fluorescent-substance-containing resin, in which a fluorescent substance is dispersed in liquid light-transmitting resin, is provided so as to fill an area surrounded by the second light reflection resin layer 120. Then, the fluorescent-substance-containing resin thus provided is hardened at a predetermined temperature for a predetermined period of time. This is how the sealing resin 122 is formed.

FIGS. 7(b) and 8(b) are cross sectional views illustrating states where the sealing resin 122 has been formed. The sealing resin 122 covers (i) the first light reflection resin layer 108 which is provided on the conductor line 106a, (ii) the plurality of light-emitting elements 110, and (iii) the wires 112 (see FIGS. 7(b) and 8(b)).

<Dividing of Substrate>

Lastly, the light-emitting devices 100 are divided into individual ones along the dividing lines 160 shown in FIG. 9. The light-emitting devices 100 can be divided by a method in which the front face of the substrate 102a is cut, with the use of a dividing blade, along dividing grooves (not illustrated), which are provided in a back face of the substrate 102a along the dividing lines 160. According to the method, the substrate 102a is split up along the dividing grooves, and therefore the substrate 102a can be easily divided into the individual light-emitting devices 100. In this way, the light-emitting devices 100, thus individually divided as shown in FIG. 1, are produced.

According to the light-emitting device 100, (i) the conductor line 106a provided in the area in which the plurality of light-emitting elements 110 are provided is covered with the first light reflection resin layer 108, (ii) the conductor lines 106b through 106e which are provided below the second light reflection resin layer 120 are directly covered with the second light reflection resin layer 120, and (iii) the printed resistor 104 provided below the second light reflection resin layer 120 is covered with the second light reflection resin layer 120 via the first light reflection resin layer 108.

In a case where a number of light-emitting elements are provided on a substrate, having a single layer structure, of a light-emitting device, wiring of a conductor line generally becomes complicated, in such a way that the conductor line is provided in the center of a light-emitting section and more than one of the conductor lines are provided. Moreover, a printed resistor can be provided so as to protect the number of light-emitting elements. The conductor line and the printed resistor, each of which is a conductive member, absorb light, and therefore cause the light emission to be nonuniform, lower in light output amount, and undesired or uneven in chromaticity.

On the other hand, according to the configuration of the light-emitting device 100, the conductor line 106 and the printed resistor 104 are covered with the first light reflection resin layer 108 and the second light reflection resin layer 120, which efficiently reflect light emitted from the plurality of light-emitting elements 110. This makes it possible to (i) sufficiently suppress absorption of light by the conductor line 106 and the printed resistor 104 and (ii) prevent the light emission from becoming nonuniform, lower in light output amount, and undesired or uneven in chromaticity. Therefore, it is possible to provide the light-emitting device 100 which (i) reduces absorption of light so as to achieve excellent light extraction efficiency, and (ii) is highly reliable.

In particular, absorption of light by the printed resistor 104, which is black, can be suppressed to the minimum by disposing the printed resistor 104 so as to be (i) entirely covered with the first light reflection resin layer 108 below the second light reflection resin layer 120 and (ii) covered with the second light reflection resin layer 120 as widely as possible. This makes it possible to prevent a decrease in optical output of the light-emitting device 100. Moreover, gap is prevented or reduced with the configuration in which the printed resistor 104 is covered with the two layers, i.e., the first light reflection resin layer 108 and the second light reflection resin layer 120.

This makes it possible to prevent the sealing resin 122 from leaking outside, and therefore the sealing resin 122 can be formed stably.

Note that the number of the plurality of light-emitting elements 110 provided in the light-emitting device 100 is not limited to 60, but any plural number of light-emitting elements 110 can be provided. This makes it possible to provide a light-emitting device which achieves excellent light extraction efficiency and can emit light with high intensity. Moreover, the electric connection (circuit configuration) of the plurality of light-emitting elements 110 is not limited to that described above. It is therefore possible that two or more of series circuit sections, in each of which two or more of light-emitting elements 110 are connected in series, can be connected in parallel with each other between the anode electrode 114 and the cathode electrode 116.

According to the embodiment, the plurality of light-emitting elements 110 are provided in both right and left areas which are separated by the conductor line 106a. However, it is also possible to further provide another conductor line(s) 106 so that (i) the plurality of light-emitting elements 110 are provided in three or more areas, which are arranged in the x-direction, and (ii) the light-emitting elements 110, which are provided in each of the three or more areas, are connected in series and parallel with each other. In such a case, the conductor line(s), which is provided in the area in which the plurality of light-emitting elements 110 are provided, can be covered with the first light reflection resin layer 108, as with the conductor line 106a.

In view of this, it is preferable that the first light reflection resin layer 108 is formed in at least three areas. That is, the first light reflection resin layer 108 can be provided above another conductive member, which is provided depending on a configuration and absorbs light, as long as the first light reflection resin layer 108 is formed at least on the printed resistors 104a and 104b and the conductor line 106a.

According to the light-emitting device 100, all the plurality of light-emitting elements 110 have identical shapes. However, the present embodiment is not limited to this, and therefore the plurality of light-emitting elements 110 can have respective different shapes. For example, a light-emitting element 110, which has a square shape when viewed from above, can be used as appropriate.

Note that the printed resistor 104 is provided for protecting the plurality of light-emitting elements 110. However, the printed resistor 104 does not necessarily need to be provided in the light-emitting device 100. A size of the printed resistor 104 and how to provide the printed resistor 104 are determined depending on (i) the number of the plurality of light-emitting elements 110 to be provide and (ii) a usage environment (such as an amount of electrostatic discharge withstand voltage which may be possibly applied to the plurality of light-emitting elements 110).

In a case where conductive members, such as the conductor line 106 and the printed resistor 104, which absorb light are partially provided on the substrate 102 of the light-emitting device 100, it is possible that (i) the conductive members, which is provided in the area in which the plurality of light-emitting elements 110 are provided, is covered with the first light reflection resin layer 108, (ii) the conductive members, which is provided below the second light reflection resin layer 120, is covered with the second light reflection resin layer 120 via the first light reflection resin layer 108, or covered with the second light reflection resin layer 120 directly.

The present invention is not limited to the embodiments, but can be altered by a skilled person in the art within the scope of the claims. An embodiment derived from a proper combination of technical means disclosed in respective different embodiments is also encompassed in the technical scope of the present invention.

The light-emitting device of the present invention includes: a substrate which has a single layer structure in which a conductive member is provided on part of a surface of the substrate; a plurality of light-emitting elements which are directly provided on the surface of the substrate so as to be electrically connected with the conductive member; a first light reflection resin layer which is made of a first resin having a light reflection property; a second light reflection resin layer which is made of a second resin having a light reflection property, the second light reflection resin layer being provided in a looped shape on the surface of the substrate so as to surround an area in which the plurality of light-emitting elements are provided; and a sealing resin which covers the plurality of light-emitting elements, in the area in which the plurality of light-emitting elements are provided, the conductive member being covered with the first light reflection resin layer, and, under the second light reflection resin layer, the conductive member being covered with the second light reflection resin layer via the first light reflection resin layer, or being covered with the second light reflection resin layer directly.

According to the light-emitting device of the present invention, it is preferable that, under the second light reflection resin layer, the conductive member is provided so as to be farther from the plurality of light-emitting elements than an intermediate position between an inner side edge and an outer side edge of the second light reflection resin layer.

According to the light-emitting device of the present invention, it is preferable that the conductive member encompasses at least: a first conductor line which extends in a first direction on the surface of the substrate; a second conductor line which (i) is aligned with the first conductor line in a second direction, which is perpendicular to the first direction, and (ii) extends in the first direction; a third conductor line which extends in the first direction on an extension of the first conductor line; a fourth conductor line which (i) is aligned with the third conductor line in the second direction and (ii) extends in the first direction on an extension of the second conductor line; a fifth conductor line which (i) is connected with the second conductor line and the third conductor line and (ii) extends in the second direction; a first printed resistor which extends in the second direction so as to be in contact with the first conductor line and the second conductor line; and a second printed resistor which extends in the second direction so as to be in contact with the third conductor line and the fourth conductor line, the fifth conductor line being disposed in the area in which the plurality of light-emitting elements are provided, and the first conductor line, the second conductor line, the third conductor line, the fourth conductor line, the first printed resistor, and the second printed resistor being disposed below the second light reflection resin layer.

According to the light-emitting device of the present invention, it is preferable that, when viewed from above, the fifth conductor line is provided so as to divide the area, in which the plurality of light-emitting elements are provided, into at least two areas.

In a case where a number of the plurality of light-emitting elements are provided on the substrate having the single layer structure, it is particularly preferable to provide a conductor line in such a manner that the fifth conductor line is provided. This makes it possible to suppress nonuniformity in emission of light.

According to the light-emitting device of the present invention, it is preferable that the first light reflection resin layer includes first light reflection resin layers provided in respective at least three areas.

According to the light-emitting device of the present invention, it is preferable that the first printed resistor and the second printed resistor are covered with the first light reflection resin layers, respectively.

According to the light-emitting device of the present invention, it is preferable that a part of the first light reflection resin layer, which part covers the fifth conductor line, has a height which falls within a range between 5 μm and 50 μm.

According to the configuration, it is possible to prevent effects on chromaticity, optical output, and uniformity in emission of light which effects are caused by the stack of the fifth conductor line and the first light reflection resin layer, which is provided in the area in which the plurality of light-emitting elements are provided.

According to the light-emitting device of the present invention, it is preferable that some of the plurality of light-emitting elements are provided in (i) a first area surrounded by the first conductor line, the second conductor line, the fifth conductor line, and the first printed resistor and the others of the plurality of light-emitting elements are provided in (ii) a second area surrounded by the third conductor line, the fourth conductor line, the fifth conductor line, and the second printed resistor; two or more first series circuit sections are provided in parallel to connect the first conductor line with the second conductor line, each of the two or more first series circuit sections being made up of two or more of the plurality of light-emitting elements, and the two or more of the plurality of light-emitting elements being connected in series with each other; and two or more second series circuit sections are provided in parallel to connect the third conductor line with the fourth conductor line, each of the two or more second series circuit sections being made up of two or more of the plurality of light-emitting elements, and the two or more of the plurality of light-emitting elements being connected in series with each other.

According to the light-emitting device of the present invention, it is preferable that a distance between the first printed resistor and one of the plurality of light-emitting elements which one is nearest to the first printed resistor is 0.55 mm or longer; a distance between the second printed resistor and one of the plurality of light-emitting elements which one is nearest to the second printed resistor is 0.55 mm or longer; and a distance between the fifth conductor line and one of the plurality of light-emitting elements which one is nearest to the fifth conductor line is 0.55 mm or longer.

According to the light-emitting device of the present invention, it is preferable that a distance between any adjacent two of the plurality of light-emitting elements is 0.65 mm or longer, the any adjacent two of the plurality of light-emitting elements being (i) adjacent to each other in the first direction and (ii) between the first conductor line and the second conductor line or between the third conductor line and the fourth conductor line.

According to the light-emitting device of the present invention, it is preferable that each of the plurality of light-emitting elements (i) has a rectangular shape when viewed from above and (ii) is provided so that its longer side extends in the second direction.

According to the light-emitting device of the present invention, it is preferable that the substrate is a ceramic substrate made of ceramic.

According to the light-emitting device of the present invention, it is preferable that the sealing resin is provided so as to be in contact with a surface of the substrate. This makes it possible to improve adhesiveness between the substrate and the sealing resin.

According to the light-emitting device of the present invention, it is preferable that the sealing resin covers the first light reflection resin layer which covers the conductive member in the area in which the plurality of light-emitting elements are provided.

According to the light-emitting device of the present invention, it is preferable that the sealing resin is made of a light-transmitting resin containing a fluorescent substance.

INDUSTRIAL APPLICABILITY

The present invention is suitably applicable to a field in relation to a light-emitting device including a light-emitting element, and also to a field in relation to a method for producing a light-emitting device. Further, the present invention can be widely used in a field of electronics devices, including a light-emitting device, such as an illuminating device and a display device.

REFERENCE SIGNS LIST

100: Light-emitting device
102: Substrate
104: Printed resistor (Conductive member)
104a: Printed resistor (First printed resistor)
104b: Printed resistor (Second printed resistor)
106: Conductor line (Conductive member)
106a: Conductor line (Fifth conductor line)
106b: Conductor line (First conductor line)
106c: Conductor line (Second conductor line)
106d: Conductor line (Third conductor line)
106e: Conductor line (Fourth conductor line)
108: First light reflection resin layer
110: Light-emitting element
112: Wire
120: Second light reflection resin layer
122: Sealing resin
700: Nozzle
710: Opening

The invention claimed is:
1. A light-emitting device comprising:
a substrate which has a single layer structure in which a conductive member is provided on part of a surface of the substrate;
a plurality of light-emitting elements which are directly provided on the surface of the substrate so as to be electrically connected with the conductive member;
a first light reflection resin layer which is made of a first resin having a light reflection property;
a second light reflection resin layer which is made of a second resin having a light reflection property, the second light reflection resin layer being provided in a looped shape on the surface of the substrate so as to surround an area in which the plurality of light-emitting elements are provided; and
a sealing resin which covers the plurality of light-emitting elements, wherein:
in the area in which the plurality of light-emitting elements are provided, the conductive member being covered with the first light reflection resin layer,
in a peripheral of the area in which the plurality of light-emitting elements are provided, the conductive member being covered with the second light reflection resin layer, a plurality of wires are connected with the conductive member, and the plurality of wires are at least partially covered with the second light reflection resin layer.

* * * * *